United States Patent
Saèd et al.

(10) Patent No.: US 7,453,952 B2
(45) Date of Patent: Nov. 18, 2008

(54) PREDISTORTION CIRCUIT FOR A TRANSMIT SYSTEM

(76) Inventors: Aryan Saèd, 812-265 Poulin Avenue, Ottawa, Ontario (CA) K2B 7Y8; Jean-Paul Rene DeCruyenaere, 2404 Malone Crescent, Ottawa, Ontario (CA) K2C 1L5

( * ) Notice: Subject to any disclaimer, the term of this patent is extended or adjusted under 35 U.S.C. 154(b) by 801 days.

(21) Appl. No.: 10/613,355

(22) Filed: Jul. 3, 2003

(65) Prior Publication Data

US 2005/0002470 A1   Jan. 6, 2005

(51) Int. Cl.
H04L 25/03 (2006.01)

(52) U.S. Cl. .................................. 375/296; 375/297

(58) Field of Classification Search ................. 375/296, 375/297; 330/2, 10, 149; 455/114.3, 341
See application file for complete search history.

(56) References Cited

U.S. PATENT DOCUMENTS

| | | | |
|---|---|---|---|
| 5,650,758 | A | 7/1997 | Xu et al. |
| 5,699,383 | A | 12/1997 | Ichiyoshi |
| 5,880,633 | A | 3/1999 | Leizerovich et al. |
| 5,990,738 | A * | 11/1999 | Wright et al. ............... 330/149 |
| 6,043,707 | A | 3/2000 | Budnik |
| 6,054,896 | A | 4/2000 | Wright et al. |
| 6,072,364 | A | 6/2000 | Jeckeln et al. |
| 6,075,412 | A | 6/2000 | Bainvoll |
| 6,141,390 | A | 10/2000 | Cova |
| 6,147,553 | A * | 11/2000 | Kolanek ..................... 330/10 |
| 6,208,207 | B1 | 3/2001 | Cavers |
| 6,211,733 | B1 | 4/2001 | Gentzler |
| 6,215,354 | B1 * | 4/2001 | Kolanek et al. ............... 330/2 |
| 6,246,286 | B1 | 6/2001 | Persson |
| 6,342,810 | B1 | 1/2002 | Wright et al. |
| 6,388,518 | B1 | 5/2002 | Miyalani |

(Continued)

FOREIGN PATENT DOCUMENTS

EP   0930699   7/1999

(Continued)

OTHER PUBLICATIONS

Birafane et al., Phase-Only Predistortion for LINC Amplifiers with Chireix-Outphasing Combiners, Jun. 6, 2005, IEEE Transactions on Microwave Theory and Techniques, vol. 53, Issue 6, Part 2, pp. 2240-2250. □□.*

(Continued)

*Primary Examiner*—Mohammed Ghayour
*Assistant Examiner*—Lawrence B Williams
(74) *Attorney, Agent, or Firm*—Stolowitz Ford Cowger LLP (57) ABSTRACT

Systems and methods related to amplifier systems which use a predistortion subsystem to compensate for expected distortions in the system output signal. A predistortion subsystem receives an input signal and applies a predistortion modification to the input signal. The predistortion modification may be a phase modification, a magnitude modification, or a combination of both. The predistorted signal is then received by an amplifier subsystem. The amplifier subsystem decomposes the predistorted signal into separate components, each having a constant envelope phase modulation, and separately amplifies each component. The phase modulated and amplified components are then recombined to arrive at an amplitude and phase modulated and amplified output signal. The predistortion modification is applied to the input to compensate for distortions introduced in the signal by the amplifier subsystem.

19 Claims, 3 Drawing Sheets

U.S. PATENT DOCUMENTS

| | | | |
|---|---|---|---|
| 6,734,731 | B2 | 5/2004 | Cavers et al. |
| 6,737,914 | B2* | 5/2004 | Gu .................................. 330/2 |
| 6,836,183 | B2 | 12/2004 | Wight |
| 6,904,267 | B2 | 6/2005 | Hongo et al. |
| 6,940,916 | B1 | 9/2005 | Warner et al. |
| 6,943,627 | B2 | 9/2005 | Leyonhjelm et al. |
| 6,975,167 | B2* | 12/2005 | Saed ........................... 330/149 |
| 6,980,604 | B2 | 12/2005 | Kubo et al. |
| 6,985,704 | B2 | 1/2006 | Yang et al. |
| 7,015,752 | B2* | 3/2006 | Saed ........................... 330/149 |
| 7,026,871 | B2* | 4/2006 | Saed ........................... 330/149 |
| 7,026,872 | B2* | 4/2006 | Saed ........................... 330/149 |
| 7,034,613 | B2* | 4/2006 | Saed ........................... 330/149 |
| 7,068,101 | B2* | 6/2006 | Saed et al. .................. 330/149 |
| 7,127,005 | B2* | 10/2006 | Wight ......................... 375/295 |
| 2001/0054974 | A1 | 12/2001 | Wright |
| 2002/0034260 | A1 | 3/2002 | Kim |
| 2002/0047745 | A1* | 4/2002 | Kolanek ..................... 330/149 |
| 2002/0101937 | A1 | 8/2002 | Antonio et al. |
| 2002/0159532 | A1* | 10/2002 | Wight ......................... 375/260 |
| 2005/0001677 | A1 | 1/2005 | Saed |
| 2005/0001678 | A1 | 1/2005 | Saed |
| 2005/0003770 | A1* | 1/2005 | Saed ........................ 455/114.3 |
| 2005/0162225 | A1 | 7/2005 | Suzuki et al. |
| 2006/0109052 | A1* | 5/2006 | Saed et al. .................. 330/149 |

FOREIGN PATENT DOCUMENTS

| | | |
|---|---|---|
| EP | 1170858 | 1/2002 |
| EP | 1 313 278 | 5/2003 |
| WO | WO 01/05026 | 1/2001 |
| WO | WO 01/56146 | 8/2001 |

OTHER PUBLICATIONS

Cox, Linear Amplification with Nonlinear Components, Dec. 1974, IEEE Transactions on Communications, vol. 12, Issue 12, pp. 1942-1945.*

Faulkner, Michael, Adaptive Linearization Using Predistortion-Experimental Results, May 1994, IEEE Transactions On Vehicular Technology, vol. 43, No. 2, pp. 323-332.*

Michael Faulkner; Adaptive Linearization Using Predistortion—Experimental Results, IEEE Transactions on Vehicular Technology; May 1994; pp. 323-332; vol. 43, No. 2.

* cited by examiner

PREDISTORTION CIRCUIT FOR A TRANSMIT SYSTEM

FIELD OF THE INVENTION

The present invention relates generally to power amplification systems and is specifically applicable but not limited to power amplification systems using a Chireix architecture.

BACKGROUND OF THE INVENTION

The recent revolution in communications has caused a renewed focus on wireless technology based products. Mobile telephones, handheld computers, and other devices now seamlessly communicate using wireless technology. One component that forms the core of such technology is the amplifier. Wireless devices require high efficiency amplifiers to not only extend the range of their coverage but also to conserve the limited battery power that such devices carry.

One possible architecture which may be used for such a power amplifier is called a Chireix architecture. Named after Henry Chireix who first proposed such an architecture in the 1930s, the Chireix architecture has fallen out of favor due to its seemingly inherent limitations. However, it has recently been revisited as it provides some advantages that other architectures do not have.

While the Chireix architecture provides some advantages, the process which the input signal undergoes also introduces some drawbacks. Specifically, distortions are introduced into the signal by the components in the Chireix based amplifier/ modulator system.

Based on the above, there is therefore a need for an amplifier system which provides the benefits of a Chireix based amplifier but which also compensates for or avoids the distortions which a Chireix based amplifier introduces. It is therefore an object of the present invention to provide alternatives which mitigate if not overcome the disadvantages of the prior art.

SUMMARY OF THE INVENTION

The present invention provides systems and methods related to amplifier systems which use a predistortion subsystem to compensate for expected distortions in the system output signal. A predistortion subsystem receives an input signal and applies a predistortion modification to the input signal. The predistortion modification may be a phase modification, a magnitude modification, or a combination of both. The predistorted signal is then received by an amplifier subsystem. The amplifier subsystem decomposes the predistorted signal into separate components, each having a constant envelope phase modulation, and separately amplifies each component. The phase modulated and amplified components are then recombined to arrive at an amplitude and phase modulated and amplified output signal. The predistortion modification is applied to the input to compensate for distortions introduced in the signal by the amplifier subsystem.

In a first aspect, the present invention provides a system for processing an input signal, the system comprising:
 a predistortion subsystem for receiving said input signal and for producing a predistorted signal by applying a deliberate predistortion to said input signal; and
 a signal processing subsystem receiving and processing said predistorted signal and producing a system output signal, wherein
 said predistortion subsystem distorts said input signal to compensate for distortions in said system output signal;
 said signal processing subsystem decomposes said predistorted signal into separate components, each of said separate components being processed separately; and
 said processing subsystem combines said components after processing to produce said system output signal.

In a second aspect the present invention provides a method of processing an input signal to produce a system output signal, the method comprising:
 a) receiving said input signal
 b) applying a deliberate predistortion to said input signal to result in a predistorted signal
 c) decomposing said predistorted signal into at least two component signals
 d) combining said at least two component signals to produce said system output signal.

BRIEF DESCRIPTION OF THE DRAWINGS

A better understanding of the invention will be obtained by considering the detailed description below, with reference to the following drawings in which.

DETAILED DESCRIPTION

For clarity, the following terms are to be used with the following definitions:
 AM (amplitude modulation) refers to the AM of an RF (radio frequency) signal and is equal to the magnitude of the RF signal's complex base band equivalent
 PM (phase modulation) refers to the PM of an RF signal and is equal to the phase of the RF signal's complex base band equivalent.

Figure 1:
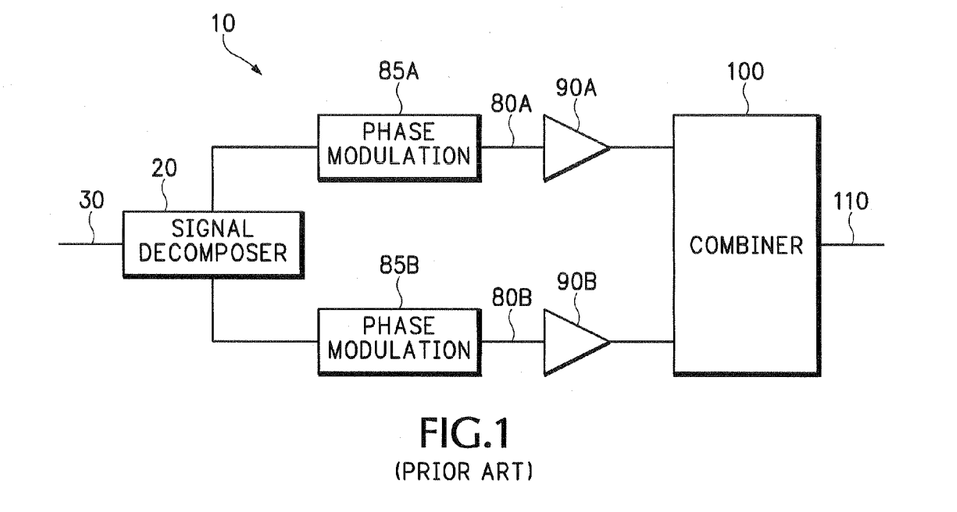
FIG. 1 is a block diagram of a Chireix architecture amplifier subsystem.

Referring to FIG. 1, a block diagram of a Chireix architecture amplifier subsystem 10 is illustrated. A signal decomposer 20 receives an input complex baseband signal 30. Phase modulated RF signals 80A, 80B are produced after the decomposed output of the decomposer 20 are phase modulated by phase modulation circuitry 85A, 85B. These phase modulated signals 80A, 80B are received by power amplifiers 90A, 90B. The phase modulated signals are thus amplified by the power amplifiers 90A, 90B and are received by a signal combiner 100. The system output signal 110 (an RF signal corresponding to the input baseband signal 30) is output from the combiner 100 and is an amplified and modulated version of the input signal 30. Phase modulation of the phase modulated signals 80A, 80B is executed after the signal decomposer 20 separates input signal 30 into at least two components. These at least two components, after phase modulation, are the signals 80A, 80B.

Figure 2:
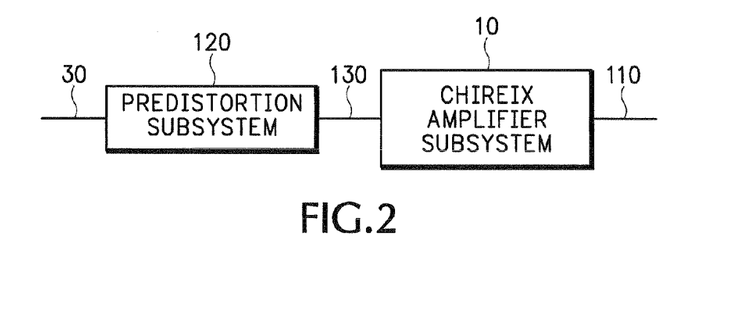
FIG. 2 is a block diagram of an amplifier system using the subsystem of FIG. 1 and a predistortion subsystem.

As noted above, the Chireix architecture amplifier subsystem 10 has been known to introduce distortions in the system output signal 110. To compensate for such distortions, a predistortion subsystem 120 is provided. Referring to FIG. 2, the predistortion subsystem 120 receives the input signal 30 and produces a predistorted signal 130. The predistorted signal 130 is received by the amplifier subsystem 10. The amplifier subsystem then produces the system output signal 110.

The distortions for which the predistortion subsystem is to compensate may come as a phase distortion, a magnitude distortion, or as a combination of both. It has been found that, without predistortion, the system output signal has an amplitude modulation (AM) envelope that is not equal to the expected and desired AM envelope. Furthermore, the phase modulation (PM) of the system output signal 110, if predistortion is not present, deviates from the expected and desired PM. Experiments have found that the AM distortion or error (magnitude distortion) of the system output signal 110 depends on the AM of the input signal. Also, it has been found that the PM distortion (or phase distortion) of the system output signal 110 depends on the AM of the input signal 30.

Figure 3A:
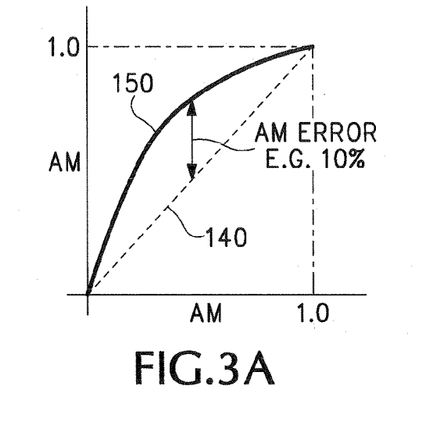
FIGS. 3A and 3B illustrate characteristics of distorted system output signals superimposed on the desired system output signal characteristics.
Figure 3B:
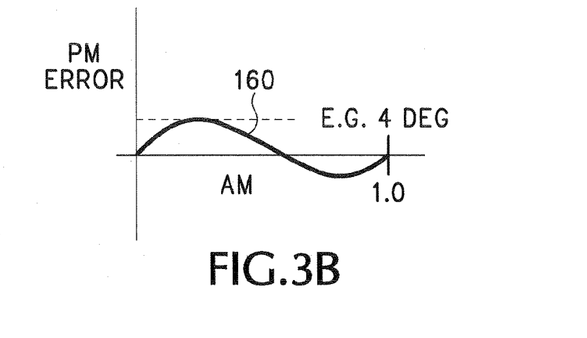

To further explain the above, FIGS. 3A, 3B are provided. As can be seen in FIG. 3A, the desired AM characteristic 140 is not followed by the resulting AM 150 of the system output signal. There is a 10% error or deviation in the middle segment of the waveform 150 from the desired AM characteristic 140. For FIG. 3B, the resulting PM 160 of the system output signal deviates from the desired PM characteristic (in this case 0°) as the AM varies. These distortion effects have been found to be caused by the Chireix architecture components.

While the above problems in distortion have been caused by the Chireix architecture, one solution is to compensate for the distortion by predistorting the input signal. As an example, if it is known that the amplifier subsystem will cause a PM distortion of x degrees at an AM of y, then predistorting the input signal by −x degrees at an AM of y should produce a system output signal with no PM distortion. The same principle can be applied for the AM distortion. If it is known that for a given input signal AM of a, the resulting system output signal will have an AM distortion of b, then predistorting the input signal in a manner which results in an output AM distortion of 0 negates the undesired effects of the AM distortion. This concept is illustrated in FIGS. 4A and 4B.

Figure 4A:
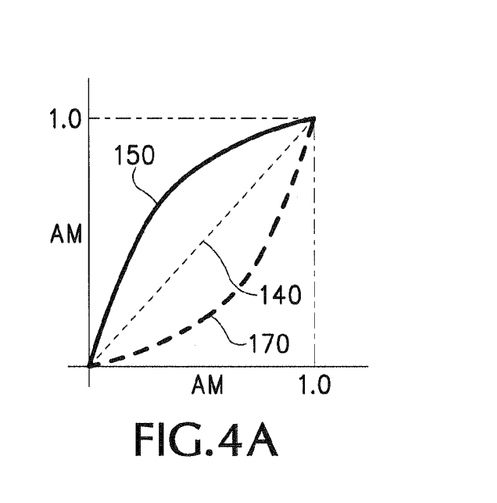
FIGS. 4A and 4B illustrate the characteristics of FIGS. 3A and 3B with characteristics of predistorted input signals.
Figure 4B:
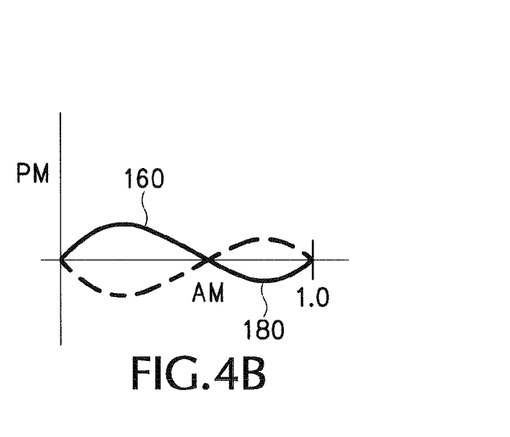

Referring to FIGS. 4A and 4B, illustrated are the desired AM predistortion output characteristic 170 and the desired PM predistortion output characteristic 180. In FIG. 4A, since the resulting AM characteristic 150 (with no predistortion) is distorted, then predistortion which results in the AM predistorted output characteristic 170 should produce the desired PM characteristic 140. Similarly, in FIG. 4B, the distortion of the resulting PM characteristic 160 (with no predistortion) can be compensated for by providing predistortion that results in a PM predistorted output characteristic 180. By specifically predistorting the input signal by the amount of the expected distortion, the resulting system output signal should be generally free of AM/AM and AM/PM distortions.

It should be noted that the predistortion modification, defined as any deliberate distortion which has been applied or is to be applied to the input signal to change at least one original characteristic of the input signal, can take many forms. Two specific types of predistortion, phase predistortion and magnitude predistortion are currently envisioned although other types are possible. These two types, separately or together, can make up the predistortion modification. In some applications, only a magnitude type predistortion modification may be required while in others only a phase type predistortion is required.

The predistortion discussion above can be implemented in the predistortion subsystem 120 illustrated in FIG. 2. A more detailed illustration of the predistortion subsystem 120 is presented in FIG. 5. While an analog implementation of the predistortion subsystem is possible, it has been found that a digital implementation was simpler to achieve. As can be seen in the embodiment illustrated in FIG. 5, the predistortion subsystem 120 has 4 main components: a Cartesian to polar conversion unit 190, a magnitude lookup table 200 (magnitude LUT), a phase lookup table 210 (phase LUT), and an adder 220. The input signal is received by the conversion unit 190 and is converted from Cartesian coordinates to polar coordinates. The converted signal is then received and used by the lookup tables 200, 210 to determine the proper amount of predistortion to be applied. The phase lookup table 210 provides the amount of phase distortion to be added to the phase value 214 by way of adder 220. The magnitude LUT 200 provides the desired value of the predistorted magnitude. This desired value is then substituted with the magnitude value received from the conversion unit 190. As can be understood from above, the magnitude value 212 received from the conversion unit 190 is determinative of the amount of predistortion required for both magnitude and phase. The predistorted signal is then passed on to the amplifier subsystem 10. For a better understanding of FIG. 5, it should be kept in mind that the input signal 30 is a digital signal having a digital representation of its AM envelope and of its PM.

Figure 5:
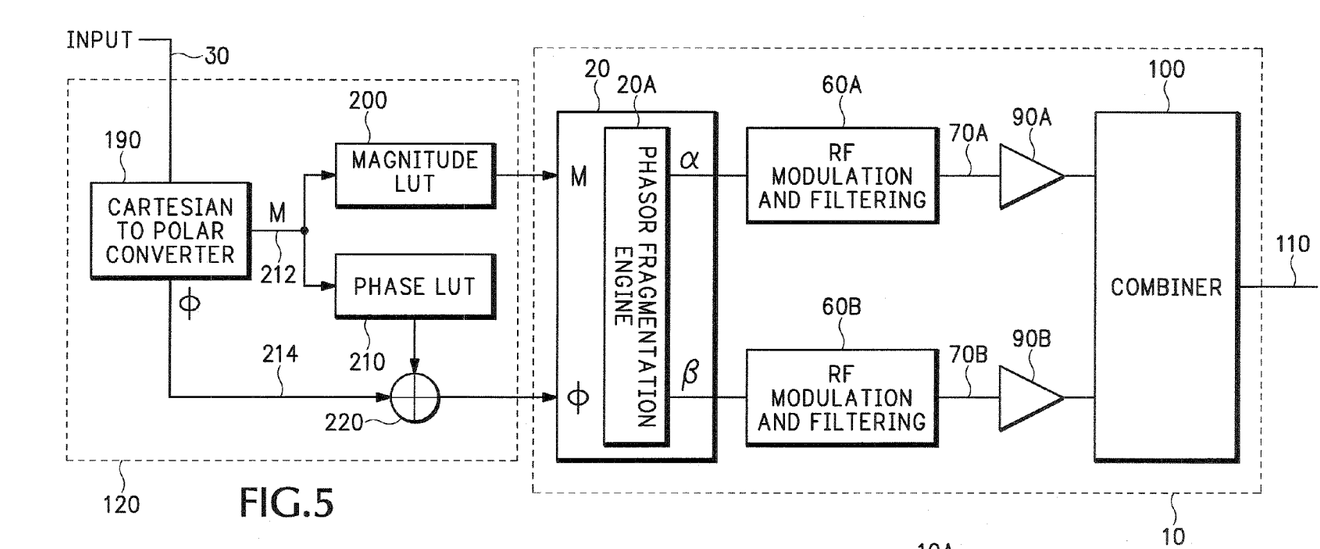
FIG. 5 is a detailed block diagram of an amplifier subsystem according to the invention incorporating the Chireix amplifier subsystem of FIG. 1 with a predistortion subsystem.

The conversion unit 190, while present, is not necessary but merely convenient and makes the predistortion easier to accomplish. As is well known, signal representations using Cartesian coordinates take the form of $z=x+jy$ where x and y are the real and imaginary components. Polar coordinates take the form of $z=Ae^{j\phi}$ where the magnitude of the signal is A and its phase is $\phi$. Since both the magnitude and the phase of the signal is to be modified by the predistortion subsystem, it is clearly more convenient to accomplish this if the signal were in polar coordinates. Again as is well known, $A=(x^2+y^2)^{1/2}$ while $\phi=\tan^{-1}(y/x)$. Once the signal has been converted into polar coordinates, adjusting the magnitude is as simple as replacing the digital representation of A by another number. Similarly, the phase can be adjusted by adding a phase correction to the phase of the signal.

After the digital signal is received and converted by the conversion unit 190, the signal is now represented by two values—a magnitude value 212 and a phase value 214. As noted above, the magnitude of the signal is determinative of the distortion of the system output signal. As such, FIG. 5 illustrates the different signal paths followed by these two values—one path for the magnitude value 212 and a second path for the phase value 214.

As noted above, the magnitude value 212 can be easily replaced by the desired magnitude value. This is done by way of magnitude lookup table block 200. The lookup table internal to the magnitude lookup table block 200 represents an input/output relationship with the input being the desired magnitude and the output being the predistorted signal magnitude. Thus, if the magnitude LUT block 200 has a table entry with an input value of 0.5 and an output value of 0.4, then if the undistorted magnitude value received by the magnitude LUT block 200 is 0.5, then this value is replaced with 0.4 as the output of the magnitude LUT block 200. Based on the LUT (lookup table) entries, the magnitude of the undistorted signal is therefore replaced with the desired predistorted magnitude.

Similar to the above, the phase value of the converted input signal is adjusted as well. As can be seen in FIG. 5, the magnitude value 212 is also received by the phase lookup table block 210. The phase lookup table block 210, based on the magnitude value, determines the proper amount of phase adjustment and adds this phase adjustment to the phase value 214 by way of the adder 220. The phase lookup table block 210 also has an lookup table resident within the phase LUT block 210 that details the appropriate phase adjustments for given magnitude values.

While the above described magnitude LUT replaces a desired value for the received magnitude, other implementations are possible. Instead of a direct replacement value, the magnitude LUT may provide a corrective value to the received magnitude. This corrective value can, depending on the implementation, be an additive or a multiplicative corrective value.

It should be noted that the lookup table entries found in the lookup tables internal to the magnitude LUT block 200 and the phase LUT block 210 may be based on experimentally derived data. As an example of how such experimentally derived data can be found, a desired output value from the amplifier subsystem 10 is first chosen. Then, an input signal to the amplifier subsystem 10 is adjusted until the desired output value is achieved. That is, if it is found that a value of q input to the amplifier subsystem 10 produces a desired amplifier output value of t, then, in the lookup table the value of q is entered as the value to be output from the lookup table block for a desired value t. For the magnitude table, the desired amplifier output value is entered as the value to be input to the lookup table block. As such, if a value of t is input to the magnitude LUT block 200, a value of q is output from the block 200 to produce an amplifier output value of t. The table entries can be found by adjustments of the entries until the desired output is obtained.

For the phase table, if experimentation shows that an input magnitude 214 of r results in a distortion of s in the phase, then the corrective value can easily be found. As such, the phase table would, for an input value 212 corresponding to the magnitude r, contain the corrective value. Again, the table entries can be adjusted.

It should be noted that the above is provided merely as an example. Other methods for filling the table with the correct entries may be employed.

As an example, such lookup tables may have the following entries:

| Input AM Magnitude | AM Predistortion Value |
|---|---|
| IN1 | AM1 |
| IN2 | AM2 |
| IN3 | AM3 |

| Input AM Magnitude | Phase Predistortion Adjustment |
|---|---|
| IN1 | PM1 |
| IN2 | PM2 |
| IN3 | PM3 |

Thus, if the amplifier system detects the input AM magnitude as IN1, then the AM predistorted magnitude should have a value of AM1 and the phase predistortion should have an added value of PM1. Thus, for predistortion, the input AM magnitude of IN1 is replaced by a value of AM1. Similarly, if the input phase is PM0, then for an input AM magnitude of IN1, then the resulting predistorted phase should be PM0+PM1.

The magnitude and phase correction concept can be further refined, if applicable, by using a polynomial to determine the required predistortion. If a mathematical relationship is found to approximate or equate the relationship between the input (such as input magnitude or input phase) and the required predistortion, this mathematical relationship can be used to generate the predistortion.

It should be noted that if the magnitude value of the input signal is not found in the lookup tables, interpolation may be used to formulate the required predistortion value. The interpolation may be linear for simplicity in implementation or it may be a more complex form of interpolation. As an example of linear interpolation, if the magnitude value is 0.45 while the magnitude lookup table only had predistortion entries for 0.4 and 0.5, then the midpoint value for the corresponding predistortion entries may be used. In this case, if the predistortion entry for a magnitude value of 0.4 is 0.3 and the predistortion entry for a magnitude value of 0.5 is 0.4, then the average between the two predistortion entries may be used, (i.e. (0.3+0.4)/2=0.35) as the predistortion value to be used. Of course while such simple linear interpolation may be used, more complex interpolation schemes, such as those using different weight values for different table entries, may be used.

It should also be clear that the circuit of FIG. 5 contains features relating to one embodiment of the amplifier subsystem. In FIG. 5, the signal decomposer 20 of FIG. 1 contains a phasor fragmentation engine 20A. The fragmentation engine 20A receives the magnitude (M) and phase ($\phi$)) representing the predistorted signal. The phasor fragmentation engine 20A deconstructs a predetermined modulation waveform (the predistorted signal) into signal components which are of equal magnitude. Further information regarding the phasor fragmentation engines may be found in the applicant's co-pending application U.S. application Ser. No. 10/205,743 entitled COMPUTATIONAL CIRCUITS AND METHODS FOR PROCESSING MODULATED SIGNALS HAVING NON-CONSTANT ENVELOPES, which is hereby incorporated by reference. In FIG. 5, these signal components are denoted by angles $\alpha$ and $\beta$. These components are each received by phase modulation and filtering blocks 60A, 60B which process the components to produce phase modulated and filtered versions of the components. The signal component 70A is an RF signal with phase $\alpha$ while signal component 70B is an RF signal with phase $\beta$. These components 70A, 70B are then amplified by amplifiers 90A, 90B. The amplified components are then recombined using combiner 100. Signal decomposition methods other than the phasor fragmentation referred to above may also be used by the signal decomposer 20.

Regarding the Chireix architecture amplifier subsystem 10, it has been found that, for higher amplification efficiencies, switch mode amplifiers are preferred for the amplifiers 90A, 90B. Such switch mode amplifiers, specifically Class D and Class F power amplifiers, provide low output impedances that allow higher amplification efficiencies. A co-pending application filed on Oct. 16, 2002 and having U.S. Ser. No. 10/272,725 entitled CHIREIX ARCHITECTURE USING LOW IMPEDANCE AMPLIFIERS provides further information on the desirable components and is hereby incorporated by reference. Such types of amplifiers are not required for the invention to function but they have been found to provide performance at a desirable level.

It should further be noted that while there are only two parallel amplifiers 90A, 90B in FIG. 1 and FIG. 5, multiple parallel amplifiers may be used as long as the decomposer 20 decomposes the predistorted signal 130 into enough components so that each component is separately amplified and phase modulated in parallel with the other components.

As another alternative, while FIG. 5 illustrates a parallel implementation of the predistortion, a serial implementation is possible. As can be seen in FIG. 5, the magnitude predistortion is applied in parallel with the phase predistortion. While this is preferable for purposes of speed, it is also possible to have cascaded predistortion stages. A magnitude predistortion can be applied to the input signal after first applying a phase predistortion.

It should also be noted that the predistortion subsystem 10 explained above does not linearize a power amplifier as is well-known in the field. Instead, the predistortion subsystem linearizes a whole power amplifier system—the output of the whole amplifier system is linearized and not simply the output of a single amplifier. Also, unlike the linearizing systems for power amplifiers that are currently known, the amplifier system discussed in this document compensates for distortions that mostly occur at mid signal amplitudes. Current single amplifier linearization systems linearize distortions that occur at large signal amplitudes.

It should further be noted that the invention may be applied to any signal processing system which decomposes a signal into components and recombines them. It has been found that signal combiners (block 100 in FIG. 1) invariably cause distortions. These combiners use addition to recombine the components and improper signal addition, such as when recombining sinusoidal components, has been found to be one cause of the distortions in the system output signal. In the above embodiment, the phasor fragmentation engine decomposes the incoming signal into vectors and the improper addition of these vectors by the combiner 100 lead to distortions in the output signal.

Figure 6:
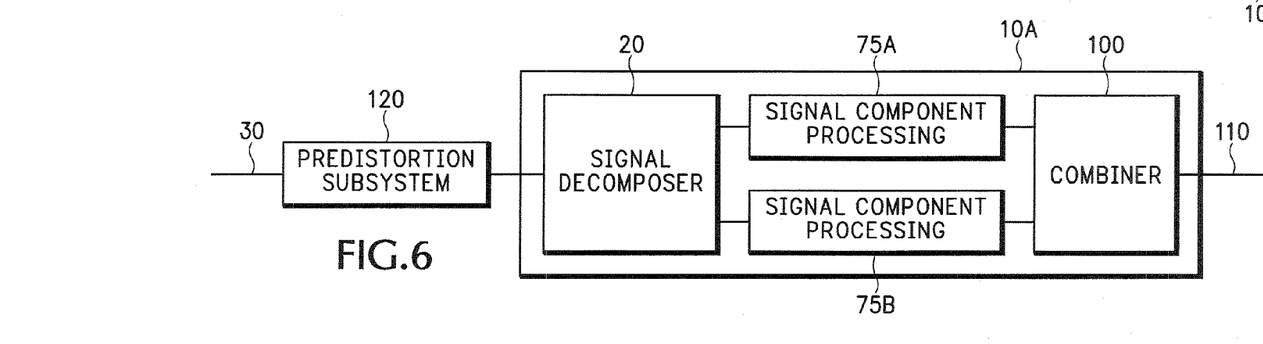
FIG. 6 is a block diagram of a signal processing system according to another embodiment of the invention.

While the above embodiment amplifies the input signal, albeit separately for each component, this need not be the only signal processing accomplished after the input signal is decomposed. Referring to FIG. 6, such a generalized system 10A (which may be part of a larger signal transmission system) is illustrated. The predistortion subsystem 120 predistorts an incoming signal 30 and compensates for distortions introduced in the system output signal 110 by the improper or imperfect recombining of the input signals components. These components are produced by the signal decomposer 20 and are separately processed by signal component processor blocks 75A, 75B. The processing executed by the blocks 75A, 75B may take the form of amplification (as in the embodiment above), phase modulation, a combination of the two, or any other signal processing which may be desired. As an example, each of the signal components illustrated in FIG. 5 may be separately phase modulated in addition to being amplified by amplifiers 90A-90B. The phase modulation may be accomplished separately or be incorporated in the signal decomposer or, as contemplated for the implementation illustrated in FIG. 5, incorporated into the modulation and filtering blocks 60A, 60B.

As can be seen in FIG. 6, the signal processing subsystem 10A receives the predistorted signal from the predistortion subsystem 120. After being received, the predistorted signal is decomposed by the signal decomposer 20 into components. These components are then separately processed by the signal component processor blocks 75A, 75B and are then recombined by the recombiner 100.

One advantage using the above invention is that it allows less stringent tolerances to be used for the system components. Previously, components had to be substantially matched so that signal processing could produce acceptable results. By using the above invention, less than substantially matched components may be used together. Errors due to a mismatch may be measured and compensated for by the predistortion subsystem.

A person understanding this invention may now conceive of alternative structures and embodiments or variations of the above all of which are intended to fall within the scope of the invention as defined in the claims that follow.

What is claimed is:

1. A system for processing an input signal, the system comprising:
    a predistortion subsystem adapted to receive said input signal and adapted to produce a predistorted signal by applying a deliberate predistortion to said input signal, wherein said predistortion subsystem is adapted to distort said input signal to compensate for distortions in a system output signal; and
    a signal processing subsystem adapted to receive and process said predistorted signal and adapted to produce said system output signal, wherein said signal processing subsystem is adapted to decompose said predistorted signal into at least two components, each of said at least two components being processed separately, said signal processing subsystem adapted to combine said at least two components after processing to produce said system output signal, and wherein said signal processing subsystem comprises
        a signal decomposer adapted to decompose said predistorted signal into said at least two components,
        at least two signal component processor blocks, each of said at least two signal component processor blocks including a respective amplifier, each of said signal component processor blocks adapted to receive a respective one of said at least two components from said signal decomposer, and each of said signal component processor blocks adapted to separately process said respective one of said at least two components and to produce a respective processed output, and
        a combiner adapted to receive said respective processed outputs from each of said at least two signal component processor blocks, said combiner producing said system output signal from said respective processed outputs of said at least two signal component processor blocks;
    wherein said predistorted signal is represented as a sequence of magnitude and phase pairs; and
    wherein said signal decomposer includes a phasor fragmentation engine to receive said sequence of magnitude and phase pairs, said phasor fragmentation engine adapted to decompose said predistorted signal into said at least two components, each of said at least two components exhibiting a respective magnitude and having a respective varying phase, said respective magnitudes of at least two of said at least two components being substantially equal.

2. The system according to claim 1 wherein said respective amplifier comprises a non-linear amplifier.

3. The system according to claim 1 wherein said system is part of a signal transmission system.

4. The system according to claim 1 wherein at least some of said distortions are due to said combiner.

5. The system according to claim 1 wherein said respective amplifier comprises a switch mode amplifier.

6. The system according to claim 1 wherein said respective amplifier has a low-output impedance.

7. The system according to claim 1 wherein said deliberate predistortion includes magnitude distortions adapted to adjust a magnitude of said input signal.

8. A The system according to claim 1 wherein said deliberate predistortion includes phase distortions adapted to adjust a phase of said input signal.

9. The system according to claim 1 wherein said deliberate predistortion is based on at least one entry in a lookup table.

10. A method of processing an input signal to produce a system output signal, the method comprising:
   receiving said input signal;
   predistorting, via applying a deliberate predistortion, said input signal to provide a predistorted signal represented as a sequence of magnitude and phase pairs;
   decomposing said predistorted signal into at least two component signals;
   separately processing each of said at least two component signals, wherein said processing further includes amplifying each of said at least two component signals; and
   combining said at least two component signals to produce said system output signal;
   wherein said decomposing comprises receiving said sequence of magnitude and phase pairs and producing therefrom said at least two component signals, each of said at least two component signals exhibiting a respective magnitude and having a respective varying phase, said respective magnitudes of at least two of said at least two component signals being substantially equal; and
   wherein said decomposing comprises converting said sequence of magnitude and phase pairs into two parallel sequences of phasors representing said at least two component signals, each of said phasors at a respective phase and substantially equal in magnitude to Vmax/2; and
   wherein Vmax is a maximum amplitude of said predistorted signal over a period of said sequence of magnitude and phase pairs.

11. The method according to claim 10 wherein said system output signal is an RF modulated version of said input signal.

12. The method according to claim 10 wherein said processing includes phase modulating at least one of said at least two component signals.

13. The method according to claim 10 wherein said receiving further includes accessing an entry in a lookup table, said deliberate predistortion being based, at least in part, on said entry.

14. The method according to claim 13 wherein said deliberate predistortion is based on an interpolation of entries in said table.

15. The system according to claim 9 wherein said deliberate predistortion is based on an interpolation of entries in said table.

16. A system according to claim 1
   wherein said phasor fragmentation engine is configured to convert said sequence of magnitude and phase pairs into two parallel sequences of phasors representing said at least two components, each of said phasors at a respective phase and substantially equal in magnitude to Vmax/2; and
   wherein Vmax is a maximum amplitude of said predistorted signal over a period of said sequence of magnitude and phase pairs.

17. A system according to claim 16
   wherein said phasor fragmentation engine is adapted to determine the respective phases of a particular pair of said phasors derived from a particular one of said sequence of magnitude and phase pairs as $\theta-\phi$ and $\theta+\phi$ respectively; and
   wherein V and $\theta$ are a respective magnitude and a respective phase of said particular one of said sequence of magnitude and phase pairs, and $\phi=\cos^{-1}(V/Vmax)$.

18. A system according to claim 1 wherein said respective amplifier comprises a class D amplifier.

19. A method according to claim 10
   wherein said decomposing determines the respective phases of a particular pair of said phasors derived from a particular one of said sequence of magnitude and phase pairs as $\theta-\phi$ and $\theta+\phi$ respectively; and
   wherein V and $\theta$ are a respective magnitude and a respective phase of said particular one of said sequence of magnitude and phase pairs, and $\phi=\cos^{-1}(V/Vmax)$.

* * * * *

UNITED STATES PATENT AND TRADEMARK OFFICE
CERTIFICATE OF CORRECTION

PATENT NO. : 7,453,952 B2  Page 1 of 1
APPLICATION NO. : 10/613355
DATED : November 18, 2008
INVENTOR(S) : Aryan Saed It is certified that error appears in the above-identified patent and that said Letters Patent is hereby corrected as shown below:

A column 9, line 1, please delete "A" before the The.

Signed and Sealed this

Thirteenth Day of July, 2010

David J. Kappos
*Director of the United States Patent and Trademark Office*